United States Patent
Nishizawa et al.

(10) Patent No.: US 8,967,484 B2
(45) Date of Patent: Mar. 3, 2015

(54) RFID TAG, WIRELESS CHARGING ANTENNA PART, METHOD OF MANUFACTURING THE SAME, AND MOLD

(75) Inventors: Masao Nishizawa, Nagano-ken (JP); Kenji Kida, Nagano-ken (JP); Fumihito Ishida, Nagano-ken (JP)

(73) Assignee: Apic Yamada Corporation, Nagano-Ken (JP)

( * ) Notice: Subject to any disclaimer, the term of this patent is extended or adjusted under 35 U.S.C. 154(b) by 0 days.

(21) Appl. No.: 13/117,995

(22) Filed: May 27, 2011

(65) Prior Publication Data
US 2012/0213885 A1    Aug. 23, 2012

(30) Foreign Application Priority Data

Feb. 22, 2011 (JP) .................................. 2011-035416
May 12, 2011 (JP) .................................. 2011-107005

(51) Int. Cl.
| | |
|---|---|
| *G06K 19/077* | (2006.01) |
| *B29C 45/16* | (2006.01) |
| *H01L 23/31* | (2006.01) |
| *B29L 31/34* | (2006.01) |
| *B29C 45/14* | (2006.01) |
| *B29C 45/37* | (2006.01) |

(52) U.S. Cl.
CPC ....... *G06K 19/07749* (2013.01); *H01L 23/3192* (2013.01); *H01L 23/315* (2013.01); *H01L 23/3135* (2013.01); *B29L 2031/3456* (2013.01); *B29C 45/14655* (2013.01); *B29C 45/1671* (2013.01); *B29C 45/372* (2013.01); *G06K 19/07718* (2013.01); *G06K 19/07724* (2013.01)
USPC .......................................... 235/492; 257/673

(58) Field of Classification Search
CPC .............. H01L 23/3192; H01L 23/315; H01L 23/3135
USPC ......................................................... 235/492
See application file for complete search history.

(56) References Cited

U.S. PATENT DOCUMENTS

| | | | |
|---|---|---|---|
| 5,786,626 A | | 7/1998 | Brady |
| 5,793,118 A | * | 8/1998 | Nakajima ..................... 257/790 |

(Continued)

FOREIGN PATENT DOCUMENTS

| | | |
|---|---|---|
| CN | 1234886 A | 11/1999 |
| DE | 19640255 A1 | 4/1998 |

(Continued)

OTHER PUBLICATIONS

European Search Report dated Mar. 18, 2013 for the corresponding application No. 11 167 495.8.

(Continued)

*Primary Examiner* — Thien T Mai
*Assistant Examiner* — Toan Ly
(74) *Attorney, Agent, or Firm* — NW Poulsen; AM Seralathan

(57) ABSTRACT

An RFID that performs a wireless communication, including an antenna part (10*a*) formed by a lead frame (10), a semiconductor device (30) mounted on the lead frame, a first thermoplastic resin (50) configured by performing injection molding on both surfaces of the lead frame so that the semiconductor device is filled, and including a convex portion, and a second thermoplastic resin (56) configured by performing injection molding on both surfaces of the lead frame with reference to a position of the convex portion of the first thermoplastic resin.

4 Claims, 13 Drawing Sheets

(56) References Cited

U.S. PATENT DOCUMENTS

| | | | |
|---|---|---|---|
| 5,826,328 A | 10/1998 | Brady et al. | |
| 5,946,198 A | 8/1999 | Hoppe et al. | |
| 6,308,894 B1 | 10/2001 | Hirai et al. | |
| 6,762,682 B2 | 7/2004 | Okamoto et al. | |
| 7,259,678 B2 | 8/2007 | Brown et al. | |
| 7,475,843 B2 | 1/2009 | Ueki et al. | |
| 2006/0102995 A1* | 5/2006 | Tsai et al. | 257/686 |

FOREIGN PATENT DOCUMENTS

| | | |
|---|---|---|
| JP | 8-034185 | 2/1996 |
| JP | 8-207476 | 8/1996 |
| JP | 10-013296 | 1/1998 |
| JP | 10-032214 | 2/1998 |
| JP | 10-074780 | 3/1998 |
| JP | 2000-293651 | 10/2000 |
| JP | 2001-236480 | 8/2001 |
| JP | 2003-108961 | 4/2003 |
| JP | 2003-198230 | 7/2003 |
| JP | 2006-281578 | 10/2006 |
| JP | 2008-258590 | 10/2008 |
| JP | 2009-205337 | 9/2009 |
| JP | 2011-023489 | 2/2011 |
| TW | 200532578 | 10/2005 |

OTHER PUBLICATIONS

Office Action issued for Taiwan application No. 100118847 dated Nov. 11, 2013 and English translation thereof.
Office Action of the counterpart CN application No. 201110147712.2 issued May 5, 2014 (citing CN1234886 and other references provided in a previously submitted IDS).
Office Action mailed on Sep. 2, 2014 by the Japan Patent Office for corresponding application No. 2011-107005, citing the following references: US5786626, JP10-013296, JP10-074780, and JP2000-293651.

* cited by examiner

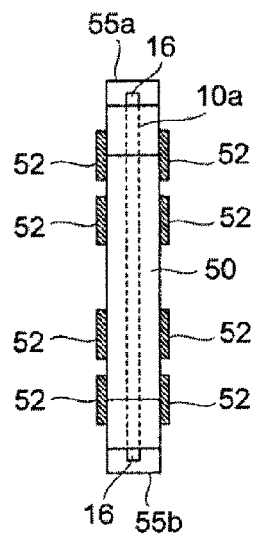
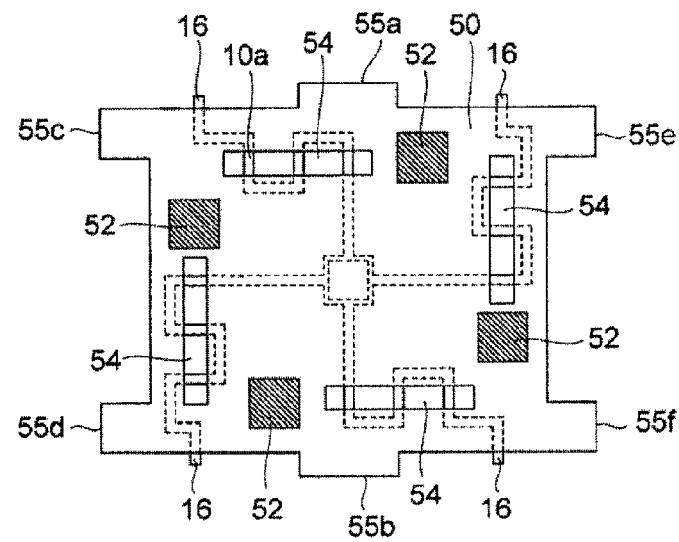
FIG. 7A　　　　　　　FIG. 7B
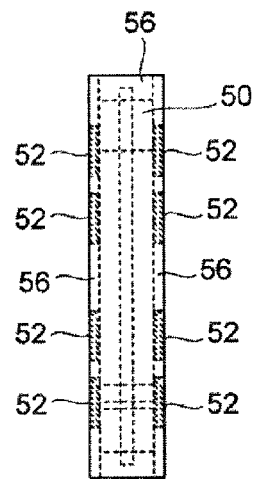
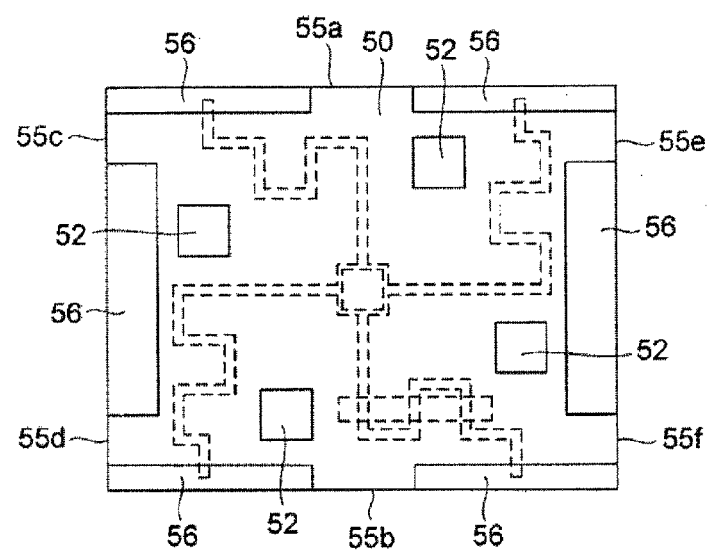
FIG. 8A　　　　　　　FIG. 8B

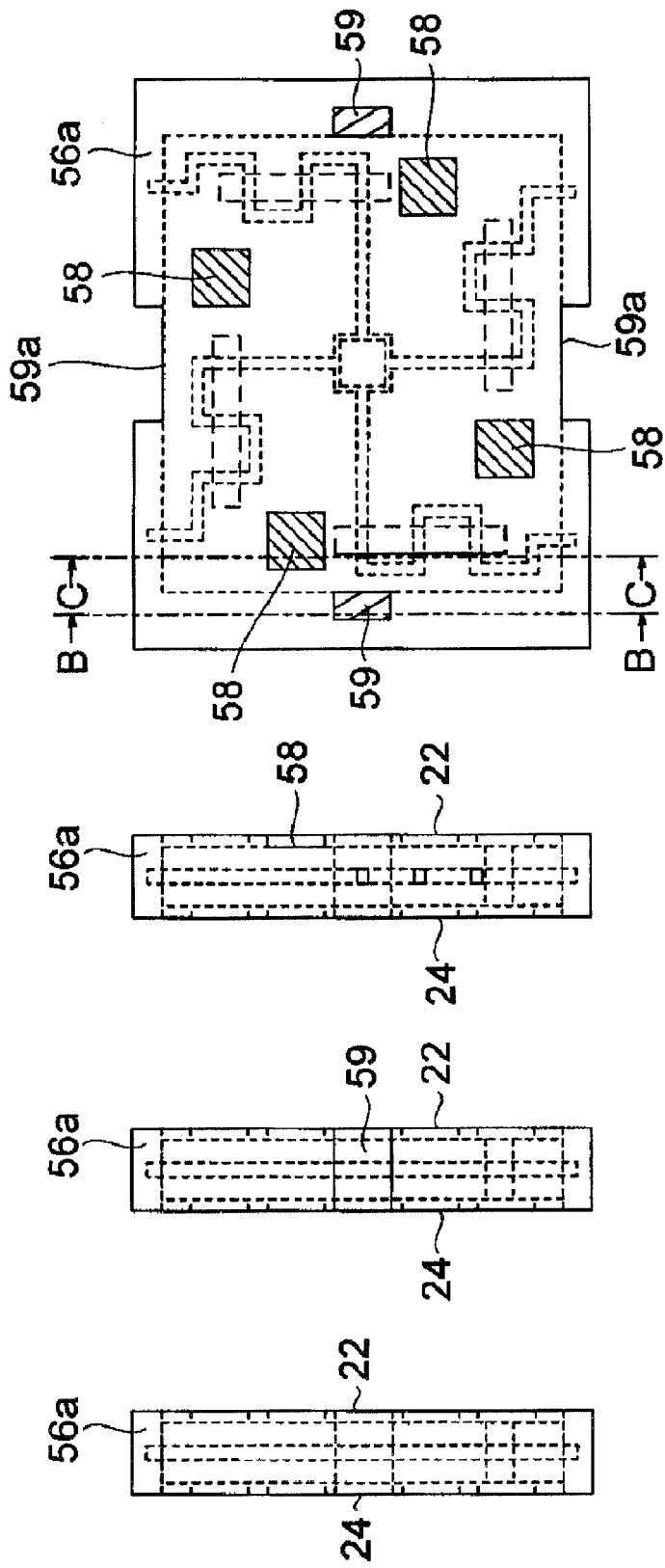

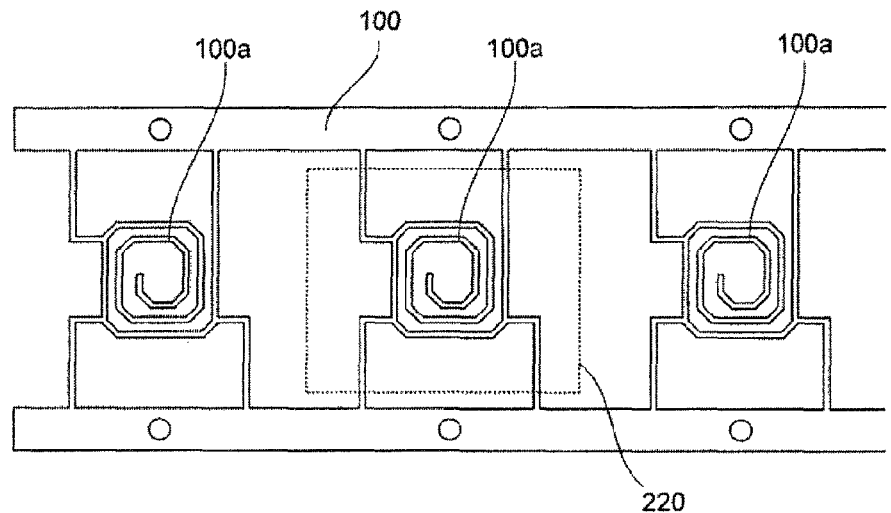
FIG. 15A
FIG. 15B
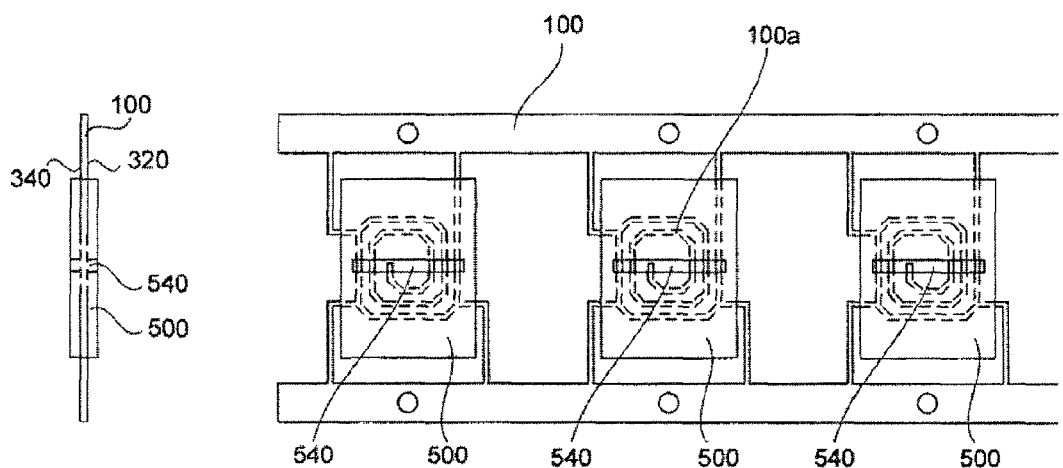
FIG. 16A
FIG. 16B

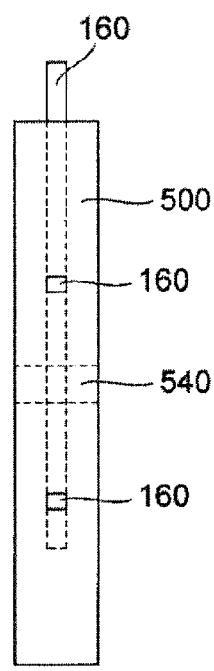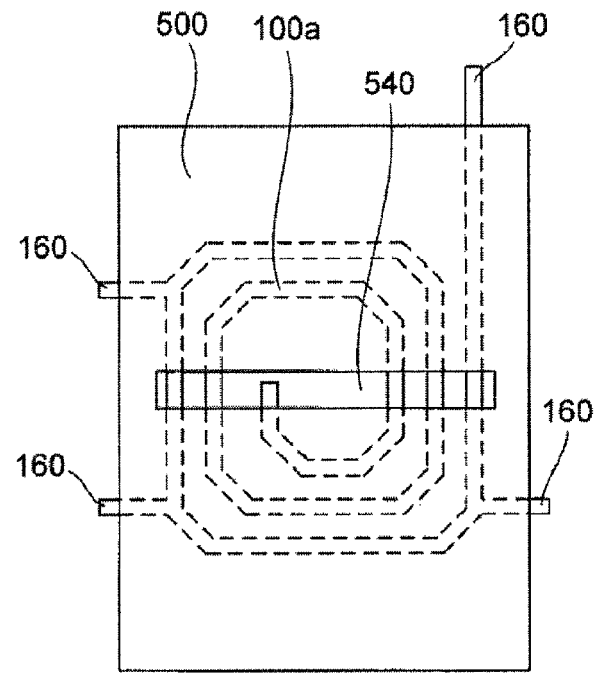
FIG. 17A  FIG. 17B
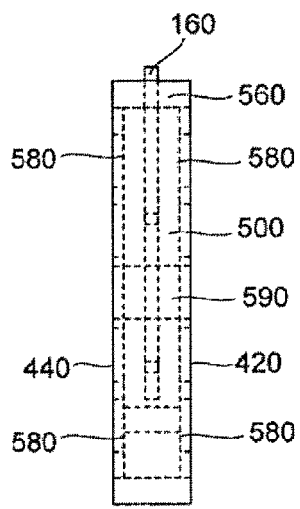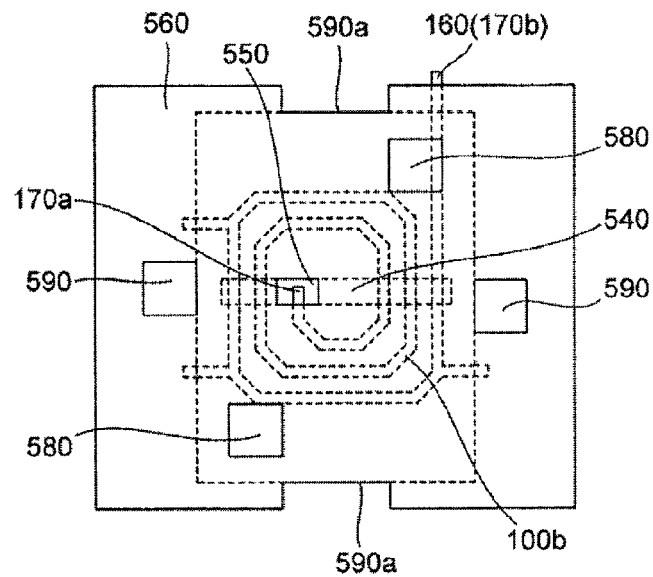
FIG. 18A  FIG. 18B

RFID TAG, WIRELESS CHARGING ANTENNA PART, METHOD OF MANUFACTURING THE SAME, AND MOLD

CLAIM FOR PRIORITY

This application hereby claims priority under 35 U.S.C. §119 of Japanese Patent Application No. 2011-035416, filed on Feb. 22, 2011, and Japanese Patent Application No. 2011-107005, filed on May 12, 2011. The entire contents of the aforementioned applications are herein expressly incorporated by reference.

FIELD OF THE INVENTION

The present invention relates to an RFID tag, a wireless charging antenna part, methods of the RFID tag and the wireless charging antenna part, and molds of manufacturing the RFID tag and the wireless charging antenna part.

DESCRIPTION OF THE RELATED ART

There is an ID tag as a representative product that includes a metal antenna and a metal coil in a plastic housing, and previously the RFID tag (wireless IC tag) that communicates information via a wireless communication has been widely used. Recently, for convenience, the RFID tag that is not embedded with a battery is used in many cases. The RFID tag that is not embedded with the battery includes a metal wire (a coil and an antenna, which is hereinafter referred to as an antenna part) in the RFID tag, and it is possible to perform an electrical communication between a tag and a reader/writer since an electromotive force is generated in the RFID from the reader/writer by an electromagnetic induction method, a radio receiving method, or a resonance method.

A wireless charger, similarly to the RFID, includes an antenna part inside it, and the charging is performed by generating the electromotive force in the wireless charger via a wireless charging antenna part by the electromagnetic induction method, the radio receiving method, or the resonance method. The RFID or the wireless charging antenna part is configured by including a metal wire (an antenna part) that is not physically connected with an external element, but there was a problem that the metal wire is deformed by a flow pressure of a resin and that the metal wire is exposed outside the resin in performing resin molding. The performance of the RFID tag or the wireless charging antenna part is deteriorated if the metal wire is deformed, and it is sensitive to a static electricity if the metal wire is exposed outside the resin, and thus an environment resistance is lowered.

In terms of this, Japanese Patent Laid-Open No. 2001-236480 discloses a wireless IC card which has an external dimension with high accuracy. The IC card disclosed in Japanese Patent Laid-Open No. 2001-236480 has a buried blank 1 that is obtained by assembling a base sheet 3 with an antenna 4 and an IC module 5, and the IC card is manufactured by fixing a whole of the buried blank 1 in an external layer 2 obtained by injection molding and by burying the antenna 4 and the module 5 in the card.

However, in the configuration of Japanese Patent Laid-Open No. 2001-236480, the external layer 2 is divided into a first layer 6 and a second layer 7. Therefore, the base sheet is easily deformed when the resin molding is performed. Furthermore, in the configuration, the alignment in an in-plane direction of the IC card cannot be correctly performed. Therefore, it is difficult to precisely control a three-dimensional position of the antenna 4, and the good performance may not be ensured.

BRIEF SUMMARY OF THE INVENTION

The present invention prevents a deformation or an external exposure of an antenna part to perform resin molding of the antenna part at a constant position to provide high-performance RFID tag and wireless charging antenna part, and methods of manufacturing the RFID tag and the wireless charging antenna part, and molds that are used for manufacturing the RFID tag and the wireless charging antenna part.

An RFID tag as one aspect of the present invention is an RFID tag that performs a wireless communication, and this RFID tag includes an antenna part formed by a lead frame, a semiconductor device mounted on the lead frame, a first thermoplastic resin configured by performing injection molding on both surfaces of the lead frame so that the semiconductor device is filled, and including a convex portion, and a second thermoplastic resin configured by performing injection molding on both surfaces of the lead frame with reference to a position of the convex portion of the first thermoplastic resin.

An RFID tag as another aspect of the present invention is an RFID tag that performs a wireless communication, and this RFID tag includes an antenna part formed by a lead frame, a semiconductor device mounted on the lead frame, a first thermoplastic resin configured by performing injection molding on both surfaces of the lead frame so that the semiconductor device is filled, and a second thermoplastic resin configured by performing injection molding on both the surfaces of the lead frame with reference to a position of an external surface of the first thermoplastic resin.

A wireless charging antenna part as another aspect of the present invention is a wireless charging antenna part that generates an electromotive force, and this wireless charging antenna part includes an antenna part formed by a lead frame, a first thermoplastic resin configured by performing injection molding on both surfaces of the lead frame and including a convex portion, and a second thermoplastic resin configured by performing injection molding on both the surfaces of the lead frame with reference to a position of the convex portion of the first thermoplastic resin.

A wireless charging antenna part as another aspect of the present invention is a wireless charging antenna part that generates an electromotive force, and this wireless charging antenna part includes an antenna part formed by a lead frame, a first thermoplastic resin configured by performing injection molding on both surfaces of the lead frame, and a second thermoplastic resin configured by performing injection molding on both the surfaces of the lead frame with reference to a position of an external surface of the first thermoplastic resin.

A method of manufacturing an RFID tag as another aspect of the present invention is a method of manufacturing an RFID tag that performs a wireless communication, and this method includes the steps of forming an antenna part by a lead frame, mounting a semiconductor device on the lead frame, performing a first molding in which injection molding of a first thermoplastic resin is performed so that the semiconductor device is filled to form a convex portion on both surfaces of the lead frame, and performing a second molding in which injection molding of a second thermoplastic resin is performed on both the surfaces of the lead frame with reference to a position of the convex portion of the first thermoplastic resin.

A method of manufacturing an RFID tag as another aspect of the present invention is a method of manufacturing an RFID tag that performs a wireless communication, and this method includes the steps of forming an antenna part by a lead frame, mounting a semiconductor device on the lead frame, performing a first molding in which injection molding of a first thermoplastic resin is performed so that the semiconductor device is filled to form a convex portion on both surfaces of the lead frame, and performing a second molding in which injection molding of a second thermoplastic resin is performed on both the surfaces of the lead frame with reference to a position of the convex portion of the first thermoplastic resin.

A method of manufacturing a wireless charging antenna part as another aspect of the present invention is a method of manufacturing a wireless charging antenna part that generates an electromotive force, and this method includes the steps of performing injection molding of a first thermoplastic resin to form a convex portion on both surfaces of the lead frame, and performing injection molding of a second thermoplastic resin on both the surfaces of the lead frame with reference to a position of the convex portion of the first thermoplastic resin.

A method of manufacturing a wireless charging antenna part as another aspect of the present invention is a method of manufacturing a wireless charging antenna part that generates an electromotive force, and this method includes the steps of performing injection molding of a first thermoplastic resin, and performing injection molding of a second thermoplastic resin including concave portions on both surfaces of the lead frame with reference to a position of an external surface of the first thermoplastic resin.

A mold as another aspect of the present invention is a mold that is used for manufacturing an RFID tag, and this mold includes a first mold of one side configured to press a lead frame that forms an antenna part from a side a first surface, a first mold of the other side configured to press the lead frame from a side of a second surface that is opposite to the first surface, a second mold of one side configured to press the lead frame from the side of the first surface, and a second mold of the other side configured to press the lead frame from the side of the second surface. The first mold of one side and the first mold of the other side are used for clamping the lead frame mounting the semiconductor device to perform injection molding of a first thermoplastic resin. The second mold of one side and the second mold of the other side are used for clamping the lead frame after the first thermoplastic resin is molded to perform injection molding of a second thermoplastic resin. The first mold of one side and the first mold of the other side are provided with concave portions configured to form convex portions that are a reference position in molding the second thermoplastic resin on the first thermoplastic resin.

A mold as another aspect of the present invention is a mold that is used for manufacturing an RFID tag, and this mold includes a first mold of one side configured to press a lead frame that forms an antenna part from a side a first surface, a first mold of the other side configured to press the lead frame from a side of a second surface that is opposite to the first surface, a second mold of one side configured to press the lead frame from the side of the first surface, and a second mold of the other side configured to press the lead frame from the side of the second surface. The first mold of one side and the first mold of the other side are used for clamping the lead frame mounting the semiconductor device to perform injection molding of a first thermoplastic resin. The second mold of one side and the second mold of the other side are used for clamping the lead frame after the first thermoplastic resin is molded to perform injection molding of a second thermoplastic resin. The second mold of one side and the second mold of the other side are provided with convex portions configured to perform injection molding of a second thermoplastic resin with reference to an external surface of the first thermoplastic resin.

A mold as another aspect of the present invention is a mold that is used for manufacturing a wireless charging antenna part, and this mold includes a first mold of one side configured to press a lead frame that forms an antenna part from a side a first surface, a first mold of the other side configured to press the lead frame from a side of a second surface that is opposite to the first surface, a second mold of one side configured to press the lead frame from the side of the first surface, and a second mold of the other side configured to press the lead frame from the side of the second surface. The first mold of one side and the first mold of the other side are used for clamping the lead frame to perform injection molding of a first thermoplastic resin. The second mold of one side and the second mold of the other side are used for clamping the lead frame after the first thermoplastic resin is molded to perform injection molding of a second thermoplastic resin. The first mold of one side and the first mold of the other side are provided with concave portions configured to form convex portions that are a reference position in molding the second thermoplastic resin on the first thermoplastic resin.

A mold as another aspect of the present invention is a mold that is used for manufacturing a wireless charging antenna part, and this mold includes a first mold of one side configured to press a lead frame that forms an antenna part from a side a first surface, a first mold of the other side configured to press the lead frame from a side of a second surface that is opposite to the first surface, a second mold of one side configured to press the lead frame from the side of the first surface, and a second mold of the other side configured to press the lead frame from the side of the second surface. The first mold of one side and the first mold of the other side are used for clamping the lead frame to perform injection molding of a first thermoplastic resin. The second mold of one side and the second mold of the other side are used for clamping the lead frame after the first thermoplastic resin is molded to perform injection molding of a second thermoplastic resin. The second mold of one side and the second mold of the other side are provided with convex portions configured to perform injection molding of a second thermoplastic resin with reference to an external surface of the first thermoplastic resin.

Further features and aspects of the present invention will become apparent from the following description of exemplary embodiments with reference to the attached drawings.

BRIEF DESCRIPTION OF THE DRAWINGS

FIGS. 7A and 7B are configuration diagrams of a lead frame antenna after cutting in Embodiment 1 (an RFID tag before a third molding is performed).

FIGS. 8A and 8B are configuration diagrams of an RFID tag after the third molding is performed in Embodiment 1.

FIGS. 13A to 13D are configuration diagrams of an RFID tag after the third molding is performed in Embodiment 2.

FIGS. 15A and 15B are configuration diagrams of a lead frame antenna that is used for a wireless charging antenna part in Embodiment 3.

FIGS. 16A and 16B are configuration diagrams of a lead frame antenna that is used for a wireless charging antenna part in Embodiment 3 (a state after a second molding is performed).

FIGS. 17A and 17B are configuration diagrams of a lead frame antenna after cutting in Embodiment 3 (a wireless charging antenna part before a third molding is performed).

FIGS. 18A and 18B are configuration diagrams of a wireless charging antenna part after the third molding is performed in Embodiment 3.

DETAILED DESCRIPTION

Figure 1A:
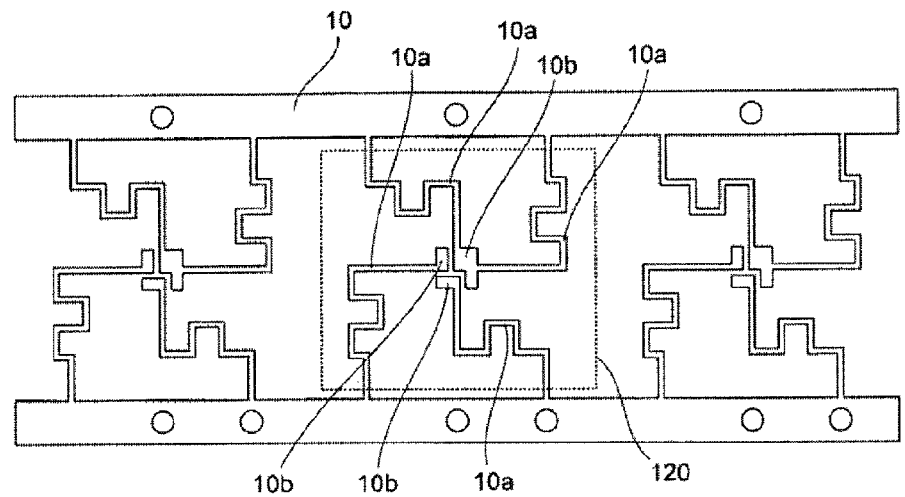
FIGS. 1A and 1B are configuration diagrams of a lead frame antenna that is used for an RFID tag in Embodiment 1 (a state before a semiconductor device is mounted).

Exemplary embodiments of the present invention will be described below with reference to the accompanied drawings. In the drawings, the same elements will be denoted by the same reference numerals and the descriptions thereof will be omitted.

Embodiment 1

Figure 1B:

First of all, a configuration of a lead frame that is used for an RFID tag (Radio Frequency Identification tag) in Embodiment 1 of the present invention will be described. FIGS. 1A and 1B are configuration diagrams of a lead frame 10 (a lead frame antenna) that is used for the RFID tag (before a semiconductor device is mounted) in the present embodiment, and FIGS. 1A and 1B illustrate a plan view and a side view of the lead frame 10, respectively.

The lead frame 10 is, for example, made of a metal of a cupper alloy or an iron alloy having a thickness of 0.15 mm, which is formed by a stamping process or an etching process. The lead frame 10 mentioned in this embodiment is a functional part, that is produced by a stamping or etching of thin metal strip, including an antenna part 10a that works as an antenna of the RFID tag performing a wireless communication and a mounting part 10b that mounts a semiconductor chip described below. The lead frame 10 is cut into some pieces by a cutting process (not shown) so that a region 120 surrounded by a dashed line is to be used for manufacturing one RFID tag. In other words, in FIG. 1A, a part of the lead frame 10 which is to be used as three RFID tags after the cutting process is illustrated.

In the region 120 of the lead frame 10, three mounting parts 10b are provided at the center. One or two antenna parts 10a are extended from each of the mounting parts 10b, and each of the antenna parts 10a is configured by including a plurality of bent parts as illustrated in FIG. 1A. However, the antenna parts 10a and the mounting parts 10b of the present embodiment are not limited to these number and shapes, and it can be configured by other number and shape.

Figure 2A:
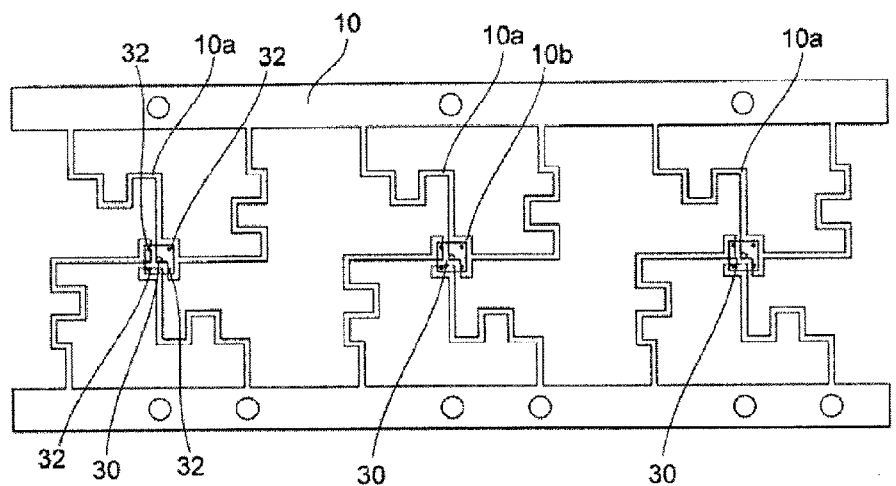
FIGS. 2A and 2B are configuration diagrams of a lead frame antenna that is used for the RFID tag in Embodiment 1 (a state after the semiconductor device is mounted).
Figure 2B:
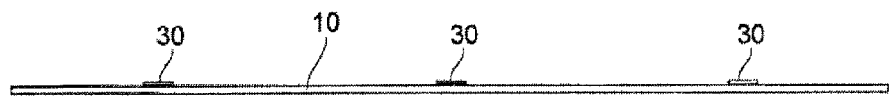

Next, referring to FIGS. 2A and 2B, a process of mounting a semiconductor device 30 on the lead frame 10 (a chip mounting process) will be described. FIGS. 2A and 2B are configuration diagrams of the lead frame 10 after the semiconductor device is mounted, and FIGS. 2A and 2B illustrate a plan view and a side view, respectively. In the chip mounting process, the semiconductor device 30 is mounted on the mounting parts 10b of the lead frame 10, and is connected by solder 32 accordingly.

As the semiconductor device 30 of the present embodiment, in some implementations it is preferable that a semiconductor package (an IC package) that is obtained by performing a resin molding of an IC chip (a bare chip) is used, and particularly a surface mount semiconductor package is used. When the semiconductor package is used as the semiconductor device 30, for example there are the following three advantages. The RFID tag is not necessarily manufactured in a clean room and therefore the manufacturing cost is reduced in manufacturing the RFID tag. Furthermore, good item can be only selected as the semiconductor device 30 to be mounted on the lead frame 10. Additionally, it is not necessary to perform a surface treatment such as a plating on the mounting part 10b.

However, the present embodiment is not limited to this, and a bare chip that is not packaged can be used as the semiconductor device 30. When the bare chip is used, it can be electrically connected with the mounting parts 10b by a flip-chip mounting or a wire bonding or others.

Figure 3A:
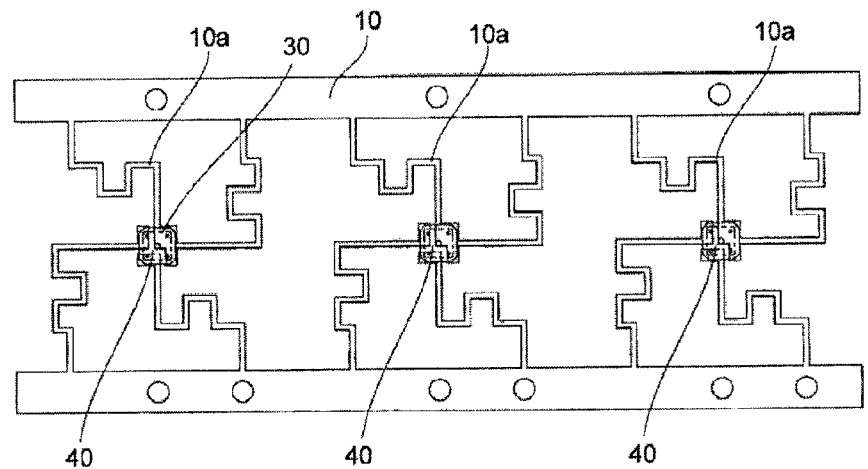
FIGS. 3A and 3B are configuration diagrams of a lead frame antenna that is used for the RFID tag in Embodiment 1 (a state after a first molding is performed).
Figure 3B:
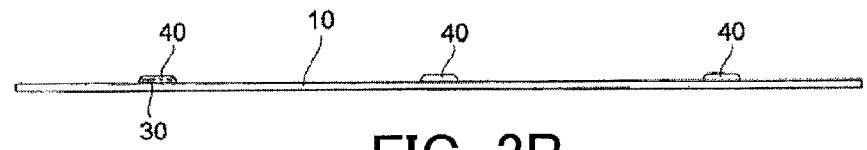

Then, referring to FIGS. 3A and 3B, a first molding process of the lead frame 10 will be described. FIGS. 3A and 3B are configuration diagrams of the lead frame 10 after the first molding process is performed, and FIGS. 3A and 3B illustrate a plan view and a side view of the lead frame 10, respectively. In the first molding, at least the semiconductor device 30 mounted on the lead frame 10, the solder 32, and the mounting part 10b are molded by a resin (covered with a resin) using a thermoset resin 40 such as an epoxy resin. In the present embodiment, the first molding with the thermoset resin 40 is performed by a potting process. However, the present embodiment is not limited to this, and the first molding can also be performed by a transfer molding or a compression molding.

A thermoplastic resin that is used in performing a second molding described below has a melting temperature of 200 to 300 degrees C., and it may be preferable that lead-free solder having a high melting point is used because the junction of the solder 32 may be disrupted in performing the second molding. On the other hand, since the melting temperature of the thermoset resin is around 160 degrees C., it does not reach the melting temperature of the solder 32. Therefore, the first molding is performed by using the thermoset resin to be able to prevent the solder 32 from melting in performing the resin molding (in performing the second molding) using the thermoplastic resin described below. When the resin molding is performed by using the thermoplastic resin, an injection pressure is higher than that of the thermoset resin. Therefore, the first molding is performed to be able to prevent the junction disruption between the semiconductor device 30 and the lead frame 10 (the mounting part 10b). Furthermore, it is generally difficult to fill the thermoplastic resin in a gap having a size smaller than or equal to 0.3 mm. Therefore, a hollow (e.g., an air void) may be generated near a solder junction part between the semiconductor device 30 and the lead frame 10. In the case that the hollow exists, the solder junction part may be disrupted by the expansion and the contraction of the air due to the temperature change. On the other hand, using the thermoset resin, for example a small gap having a size of a few micrometers can also be filled with it.

Thus, the first molding using the thermoset resin 40 is performed for protecting the junction (the solder 32) between the semiconductor device 30 and the lead frame 10 from a heat, a compression pressure, and the like in performing the second molding described below. In the present embodiment, for example an epoxy resin is used as the thermoset resin 40 used for performing the first molding, but the embodiment is not limited to this and a phenol system resin, a silicone system resin, or the like may also be used. Instead of covering a whole of the semiconductor device 30 with the thermoset resin 40, an connection and an underfill molding may also be performed only between the semiconductor device 30 and the lead frame. Although the thermoset resin is used as a first molding resin in the present embodiment, the thermoplastic resin may also be used if the reliability of the solder junction part is ensured.

Figures 4A, 4B:
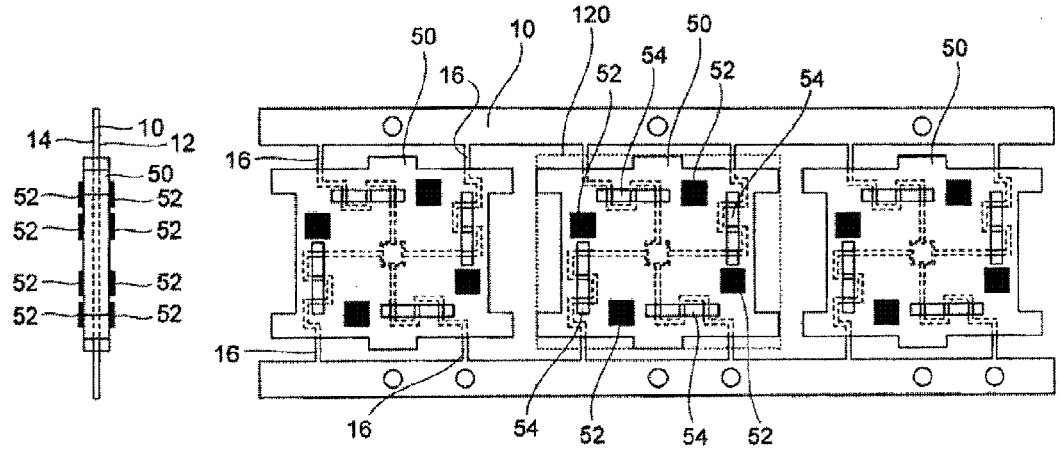
FIGS. 4A and 4B are configuration diagrams of a lead frame antenna that is used for the RFID tag in Embodiment 1 (a state after a second molding is performed).
Figure 5A:
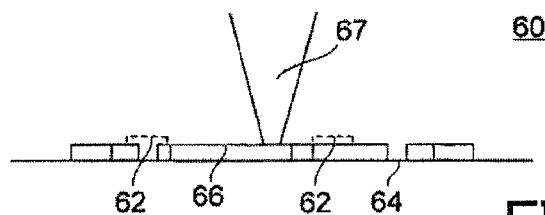
FIGS. 5A to 5E are configuration diagrams of a main part of a mold that is used for performing the second molding of the lead frame antenna in Embodiment 1.
Figure 5B:
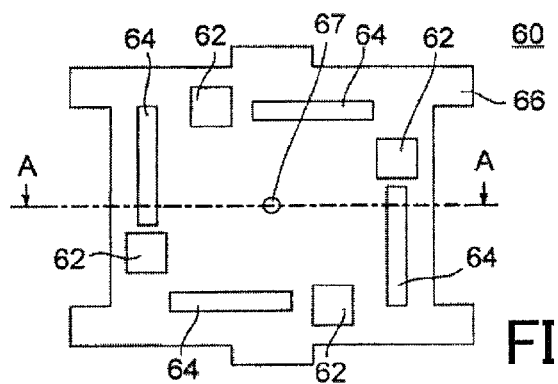
Figure 5C:
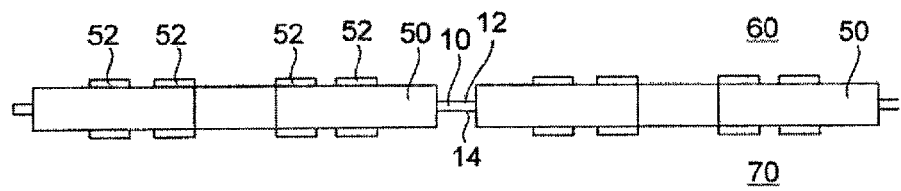
Figure 5D:
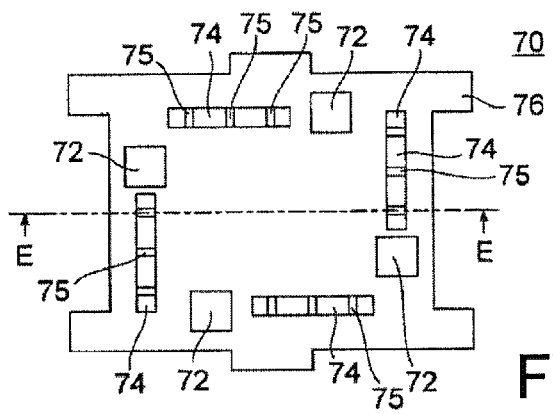
Figure 5E:
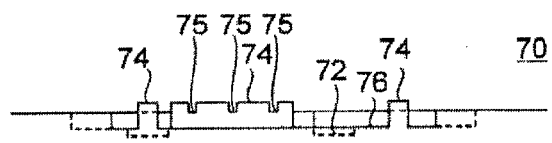
Figure 6A:
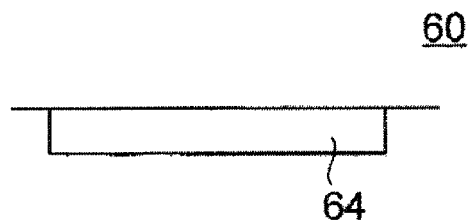
FIGS. 6A to 6F are diagrams illustrating variations of the mold that is used for performing the second molding of the lead frame antenna in Embodiment 1.
Figure 6D:
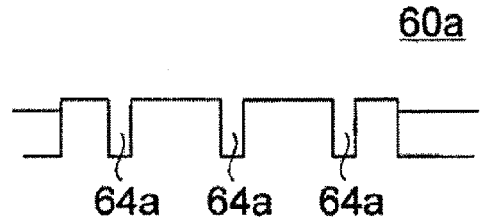
Figure 6B:
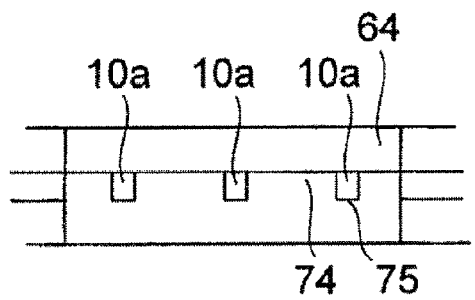
Figure 6E:
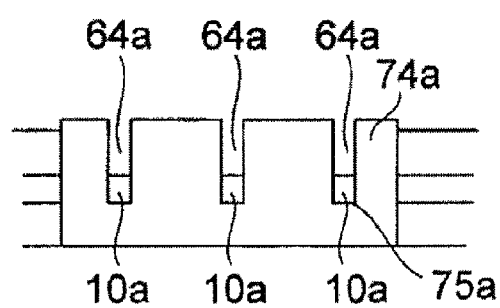
Figure 6C:
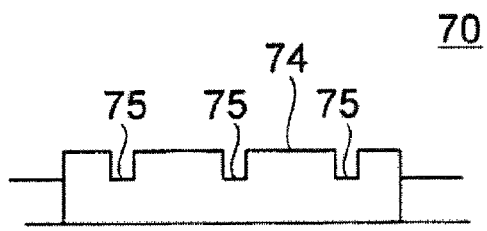
Figure 6F:
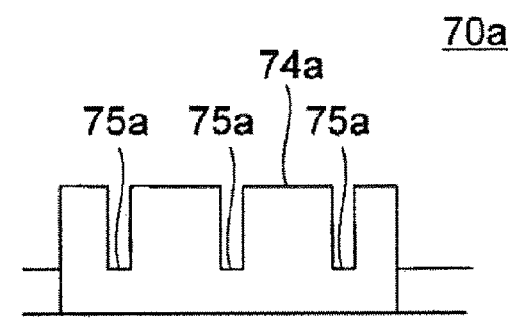

Next, referring to FIGS. 4A and 4B, 5A to 5E, and 6A to 6F, a second molding process of the lead frame 10 will be described. FIGS. 4A and 4B are configuration diagrams of the lead frame 10 after the second molding is performed, and FIGS. 4A and 4B illustrate a side view and a plan view of the lead frame 10, respectively. FIGS. 5A to 5E are configuration diagrams of a main part of a mold that is used for performing the second molding. FIGS. 5A and 5B illustrate a cross-sectional view and a plan view of a mold of one side, respectively, and an A-A cross-section in FIG. 5B corresponds to a cross section illustrated in FIG. 5A. FIG. 5C illustrates a state in which the lead frame 10 has been clamped using the mold of one side and a mold of the other side and then the second molding (the resin molding) has been performed. FIGS. 5D and 5E illustrate a plan view and a side view of the mold of the other side, respectively, and an E-E cross-section in FIG. 5D corresponds to a cross-section illustrated in FIG. 5E. FIGS. 6A to 6F are diagrams illustrating variations of the mold that is used for performing the second molding, and FIGS. 6A to 6C illustrate the mold in the present embodiment and FIGS. 6D to 6F illustrate other examples of the mold in the present embodiment.

The second molding is performed by clamping the lead frame 10 on which the semiconductor device 30 is mounted (the lead frame 10 having a configuration in which the semiconductor device 30 is filled with the thermoset resin 40) using a mold of one side 60 (a first mold of one side) and a mold of the other side 70 (a first mold of the other side) and then by performing an injection molding of the thermoplastic resin. As illustrated in FIGS. 5A and 5B, the mold of one side 60 includes an outline concave portion 66 for forming at least a part of a package outline of the RFID tag. The mold of one side 60 also includes a concave portion 62 that is capable of disposing the lead frame 10 at a constant position (a predetermined position in a direction of a thickness of the package) without deforming the lead frame 10 and without exposing the lead frame outside in the completed RFID tag after a third molding described below is performed. In the present embodiment, the four concave portions 62 are provided, but the embodiment is not limited to this. Furthermore, the mold of one side 60 includes a convex portion 64 that holds the antenna part 10a of the lead frame 10 to be fixed in clamping with the mold of the other side 70. In the present embodiment, the four convex portions 64 are provided, but the embodiment is not limited to this. The mold of one side 60 is also provided with a sprue 67 that injects a thermoplastic resin 50 (a first thermoplastic resin). In the present embodiment, the PP resin (the polypropylene resin) is used, but the embodiment is not limited to this and another resin such as an elastomer resin having elasticity may also be used.

As illustrated in FIGS. 5D and 5E, the mold of the other side 70, similarly to the mold of one side 60, includes an outline concave portion 76 for forming at least a part of the outline of the RFID tag. The mold of the other side 70 also includes a concave portion 72 that is capable of disposing the lead frame 10 at a constant position (a predetermined position in a direction of a thickness of the package) without deforming the lead frame 10 and without exposing the lead frame 10 outside in the completed RFID tag after a third molding described below is performed. In the present embodiment, the four concave portions 72 are provided, but the embodiment is not limited to this. In the present embodiment, the concave portions 72 of the mold of the other side 70 are provided at positions corresponding to the concave portions 62 of the mold of the one side 60, but alternatively these may also be provided at positions different from each other.

Furthermore, the mold of the other side 70 includes a convex portion 74 that holds the antenna part 10a of the lead frame 10 to be fixed in clamping with the mold of one side 60. In the present embodiment, the four convex portions 74 are provided, but the embodiment is not limited to this. Three concave grooves 75 that hold the antenna parts 10a to be fixed in clamping are formed on each convex portion 74. The number of the concave grooves 75 is appropriately changed in accordance with a shape of the antenna part 10a. Thus, the convex portion 74 and the concave groove 75 are concavoconvex portions that align and fix (or protect) the antenna part 10a in molding the thermoplastic resin 50.

The convex portion 64 of the mold of one side 60 (FIG. 6A) and the convex portion 74 of the mold of the other side 70 (FIG. 6C) are provided at positions corresponding to each other. As illustrated in FIG. 6B, the lead frame is clamped by using the mold of one side 60 and the mold of the other side 70 in a state where the antenna part 10a of the lead frame 10 is held on the three concave grooves 75 of the mold of the other side 70 to be fixed. Thus, since the antenna part 10a is disposed inside the concave groove 75 to be fixed with the convex portions 64 and 74 to align the position of the lead frame 10, the second molding can be performed in a state where the lead frame 10 is stably fixed while being protected from a molding resin pressure.

In this case, the concave groove 75 is configured to have a thickness deeper than that of the lead frame 10 (the antenna part 10a) by around 0.1 mm so that the mold of one side 60 and the mold of the other side 70 do not contact the antenna part 10a at the time of clamping. The gap between the concave groove 75 and the antenna part 10a is set less than or equal to 0.3 mm, and in some implementations less than or equal to 0.1 so that the thermoplastic resin 50 does not enter a space between the concave groove 75 and the antenna part 10a in performing the second molding. Therefore, the shift of the position of the antenna part caused by the flow of the resin at the time of molding can be prevented, and the molding with high alignment accuracy can be performed.

In the present embodiment, instead of the mold of one side 60 including the convex portion 64 and the mold of the other side 70 including the convex portion 74, the second molding can also be performed by using a mold of one side 60a including a convex portion 64a (FIG. 6D) and a mold of the other side 70a including a convex portion 74a (FIG. 6F). The convex portion 74a of the mold of the other side 70a is formed so as to be higher than the convex portion 74, and the convex portion 74a is provided with a concave groove 75a deeper than the concave groove 75. The convex portions 64a of the mold of one side 60a are provided at positions corresponding to the concave grooves 75a of the mold of the other side 70a. The convex portions 64a are formed to have a height lower than the depth of the concave groove 75a by a thickness of the antenna part 10a. As illustrated in FIG. 6E, the lead frame 10 is clamped by using the mold of one side 60a and the mold of the other side 70a in a state where the antenna part 10a is disposed inside the concave groove 75a to fix the antenna part 10a between an end portion of the convex portions 64a and a bottom portion of the concave grooves 75a. Therefore, even when the mold of one side 60a and the mold of the other side 70a are used, the second molding can be performed in a state where the lead frame 10 is stably fixed.

As illustrated in FIG. 5C, the mold of one side 60 that is provided with the sprue 67 presses the lead frame 10 from a side of a first surface 12 (a side of a mounting surface of the semiconductor device 30). The mold of the other side 70 presses the lead frame 10 from a side of a second surface 14 that is opposite to the first surface 12. Therefore, the injection molding of the thermoplastic resin 50 is performed from the side of the first surface 12 of the lead frame 10.

As illustrated in FIGS. 4A and 4B, in the lead frame 10 after the second molding is performed, the semiconductor device 30, the antenna part 10a, and the mounting part 10b are filled with the thermoplastic resin 50. Thus, the insulation of the semiconductor device 30 and the antenna part 10a is ensured. After the second molding is performed by the thermoplastic resin 50, in the region 120 that constitutes the RFID tag, four convex portions 52 are provided on both sides of the first surface 12 and the second surface 14. The convex portions 52 on the first surface 12 are formed by filling the thermoplastic resin 50 in the concave portions 62 of the mold of one side 60. The convex portions 52 on the second surface 14 are formed by filling the thermoplastic resin 50 in the concave portions 72 of the mold of the other side 70. The convex portions 52 are contact areas of the mold in performing a third molding described below, and they can align the lead frame 10 (the antenna part 10a) inside the package of the RFID tag with a predetermined position with high accuracy. Instead of the convex portions 52, hemispherical convex portions may also be formed. In this case, in the RFID tag that is the final product after the third molding is performed, an exposure area of the thermoplastic resin (the convex portion) by the second molding can be reduced and the existence of this convex portion can be unnoticeable.

After the thermoplastic resin 50 is formed by the second molding, in the region 120 that constitutes one RFID tag, four through holes 54 are provided. The through holes 54 are formed at positions corresponding to the convex portions 64 of the mold of one side 60 and the convex portions 74 of the mold of the other side 70 in order to align and fix the antenna part 10a and also to prevent the deformation of the antenna part 10a at the time of performing the second molding. Since the through holes 54 are not filled with the resin at the time of performing the second molding, a part of the antenna part 10a is exposed in the through holes 54. The through holes 54 are portions that align the antenna part 10a in performing the injection molding, which are filled with a thermoplastic resin 56 by the third molding described later.

Subsequently, the lead frame 10 is cut to be divided into some pieces after the second molding is performed as illustrated in FIGS. 7A and 7B. FIGS. 7A and 7B are configuration diagrams of the lead frame after the cutting (configuration diagrams of the RFID tag before the third molding is performed), and FIGS. 7A and 7B illustrate a side view and a plan view of the lead frame 10, respectively. The lead frame 10 is cut at connected lead parts 16 illustrated in FIG. 4B to be divided into some pieces after the second molding is performed. In this state, only the remained connection lead part 16 and the antenna part 10a in the through holes 54 are exposed, and the other configuration elements are filled with the thermoplastic resin 50. The thermoplastic resin 50 formed by the second molding includes convex portions 55a to 55f that constitute outer surfaces at the side surfaces. The convex portions 55a to 55f are a reference of the alignment in an in-plane direction in performing the third molding described below, which constitute an outline of the package (package surfaces) of the RFID tag.

Figure 9A:
FIGS. 9A to 9E are configuration diagrams of a main part of a mold that is used for performing the third molding of the RFID tag in Embodiment 1.
Figure 9B:
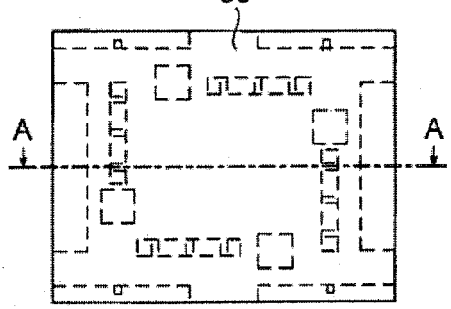
Figure 9C:
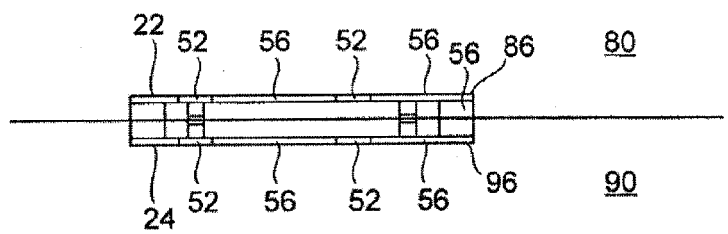
Figure 9D:
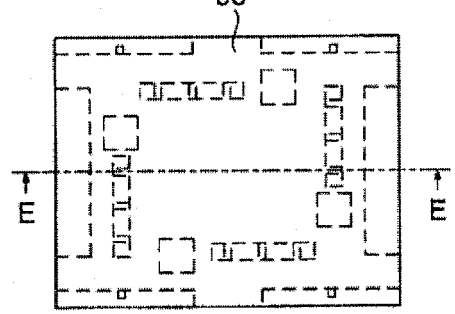
Figure 9E:

Next, referring to FIGS. 8A, 8B, and 9A to 9E, the third molding process of the RFID tag will be described. FIGS. 8A and 8B are configuration diagrams of the RFID tag after the third molding is performed, and FIGS. 8A and 8B illustrate a side view and a plan view of the RFID tag, respectively. FIGS. 9A to 9E are configuration diagrams of a main part of the mold that is used for performing the third molding. FIGS. 9A and 9B illustrate a cross-sectional view and a plan view of the mold of one side, respectively, and the cross section of FIG. 9A corresponds to an A-A cross-section in FIG. 9B. FIG. 9C illustrates a state where the RFID tag obtained after the second molding is clamped by using the mold of one side and the mold of the other side and then the third molding (the resin molding) is performed. FIGS. 9D and 9E illustrate a plan view and a side view of the mold of the other side, respectively, and the cross section of FIG. 9E corresponds to an E-E cross-section in FIG. 9D.

The third molding is performed by clamping the RFID tag obtained after the second molding is performed by using a mold of one side 80 (a second mold of one side) and a mold of the other side 90 (a second mold of the other side) and by performing the injection molding of a thermoplastic resin. As illustrated in FIGS. 9A and 9B, the mold of one side 80 includes an outline concave portion 86 that forms an outline of the package of the RFID tag. As illustrated in FIGS. 9D and 9E, the mold of the other side 90, similarly to the mold of one side 80, includes an outline concave portion 96 that forms an outline of the package of the RFID tag. In the plan views of FIGS. 9B and 9D, reference structures of the RFID tag obtained after the second molding are indicated by dashed lines.

As illustrated in FIG. 9C, the mold of one side 80 presses the RFID tag from the side of a first surface 22 (at the side of a mounting surface of the semiconductor device 30) of the RFID tag after the second molding is performed. The mold of the other side 90 presses the RFID tag from the side of a second surface 24 that is opposite to the first surface 22. The third molding in the present embodiment is performed by the injection molding of a thermoplastic resin 56 (a second thermoplastic resin). The thermoplastic resin 56 is injection-molded on both surfaces of the lead frame (the thermoplastic resin 50) with reference to the positions of the convex portions 52, and 55a to 55f of the thermoplastic resin 50 molded by the second molding. In other words, the thermoplastic resin 56 is molded with reference to the position of the convex portion 52 in a vertical direction of the RFID tag, and is also molded with reference to the positions of the convex portions 55a to 55f in an in-plane direction.

In the third molding of the present embodiment, a main surface (a bottom surface) of the outline concave portion 86 of the mold of one side 80 contacts the convex portion 52 of the first surface 22 formed by the thermoplastic resin 50. Similarly, a main surface (a bottom surface) of the outline concave portion 96 of the mold of the other side 90 contacts the convex portion 52 of the second surface 24 formed by the thermoplastic resin 50. As a result, in the third molding, the position of the antenna part 10a in a normal direction (an upward and downward direction) of the RFID tag is determined by the convex portion 52 formed on both the surfaces by performing the second molding. The side surfaces of the outline concave portion 86 of the mold of one side 80 and the side surfaces of the outline concave portion 96 of the mold of the other side 90 contact the convex portions 55a to 55f formed by the thermoplastic resin 50. As a result, in the third molding, the position of the antenna part 10a in an in-plane direction (a lengthwise and lateral direction) of the RFID tag is determined by the convex portions 55a to 55f formed by the second molding. Thus, in the third molding of the present embodiment, the convex portion 52 and the convex portions 55a to 55f formed by the second molding can also be used as a reference of the alignment in the vertical direction and the in-plane direction. At the same time, the exposed suspension lead part 16 (the lead cut part) is also filled with the thermoplastic resin 56. Therefore, according to the configuration of the present embodiment, the external exposure of the lead frame 10 (the antenna part 10a) can be surely prevented to perform the resin molding. As illustrated in FIGS. 8A and 8B, the outer surfaces of the package of the RFID tag that is a final product obtained after the third molding is performed are configured by the thermoplastic resin 50 and the thermoplastic resin 56.

As the thermoplastic resin 56 in performing the third molding, the same kind of resin as that of the thermoplastic resin 50 in performing the second molding can be used. Thus, the boundary of the two thermoplastic resins 50 and 56 that constitute the package of the RFID tag can be unnoticeable. However, the present embodiment is not limited to this, and different types of resins can be used. For example, it is effective when the permittivity of the thermoplastic resin 50 needs to be different from that of the thermoplastic resin 56.

Performing the third molding (the injection molding), the outline concave portion 86 of the mold of one side 80 and the outline concave portion 96 of the mold of the other side 90 are filled with the thermoplastic resin 56. When the third molding is finished, the RFID tag in which the lead frame is not exposed on the surfaces is completed as described in FIGS. 8A and 8B.

Although the resin-molded antenna part 10a has a different performance (a distance at which a communication can be performed) depending on the position in a thickness direction of the package (the thermoplastic resins 50 and 56) of the RFID tag, according to the configuration of the present embodiment, a high-performance RFID tag can be provided because the position of the antenna part in the thickness direction of the package can be surely controlled. Furthermore, since the position of the antenna part can be arbitrarily set, the antenna part can be disposed at an arbitrary position in the thickness direction of the package of the RFID tag by changing the height of the convex portion formed by the second molding. The RFID tag illustrated in FIGS. 8A and 8B are attached to an object to be identified using a double-faced tape or marking or the like to be used for the identification.

Embodiment 2

Next, a configuration of an RFID tag and a method of manufacturing the RFID tag in Embodiment 2 of the present invention will be described. In the present embodiment, since the configuration of the lead frame 10 (lead frame antenna) before the second molding is performed and its manufacturing method are the same as those of Embodiment 1, descriptions thereof are omitted.

Figure 10A:
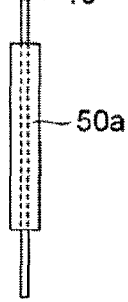
FIGS. 10A and 10B are configuration diagrams of a lead frame antenna that is used for an RFID tag in Embodiment 2 (a state after a second molding is performed).
Figure 10B:
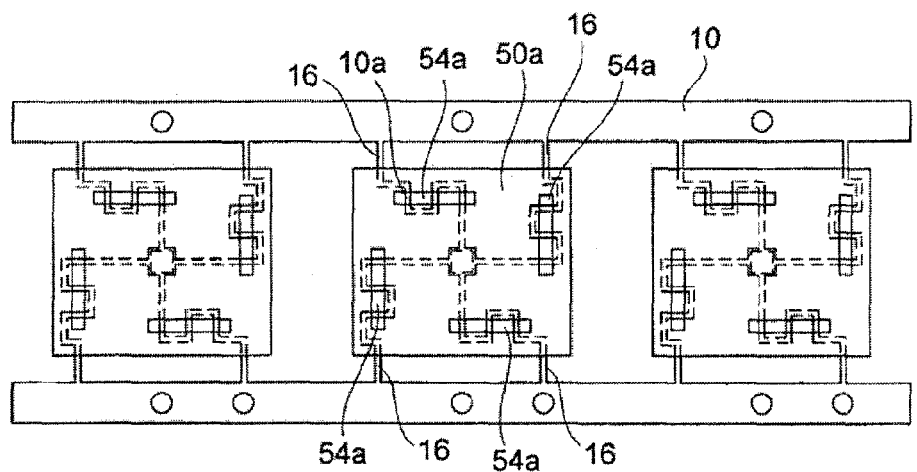
Figure 11A:
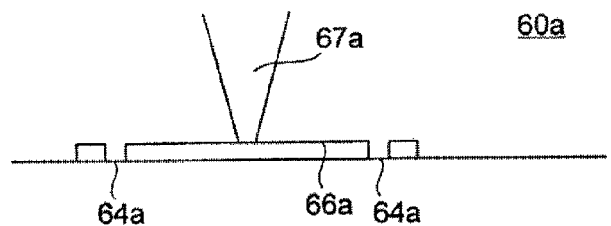
FIGS. 11A to 11E are configuration diagrams of a main part of a mold that is used for performing the second molding of the RFID tag in Embodiment 2.
Figure 11B:
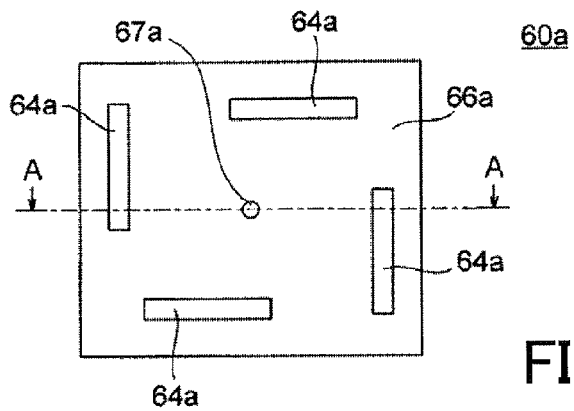
Figure 11C:
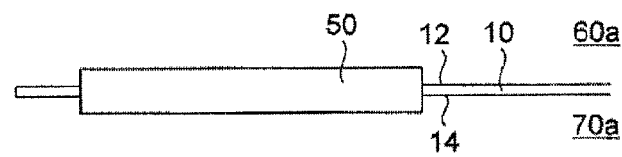
Figure 11D:
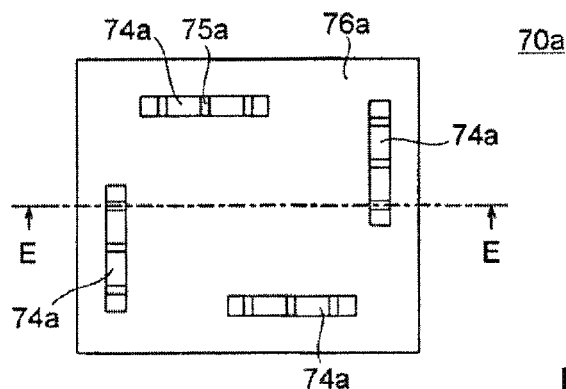
Figure 11E:
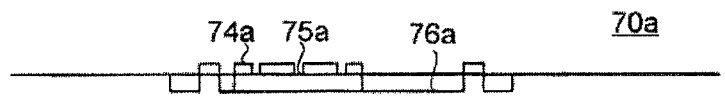

First of all, referring to FIGS. 10A and 10B, and 11A to 11E, a second molding process of the lead frame 10 will be described. FIGS. 10A and 10B are configuration diagrams of the lead frame 10 after the second molding is performed, and FIGS. 10A and 10B illustrate a side view and a plan view of the lead frame 10, respectively. FIGS. 11A to 11E are configuration diagrams of a main part of a mold that is used for performing the second molding. FIGS. 11A and 11B illustrate a cross-sectional view and a plan view of a mold of one side, respectively, and a cross section of FIG. 11A corresponds to an A-A cross section in FIG. 11B. FIG. 11C illustrates a state in which the lead frame 10 has been clamped using the mold of one side and a mold of the other side and then the second molding (the resin molding) has been performed. FIGS. 11D and 11E illustrate a plan view and a side view of the mold of the other side, respectively, and a cross section of FIG. 11E corresponds to an E-E cross section in FIG. 11D.

The second molding of the present embodiment is performed by clamping the lead frame 10 on which the semiconductor device 30 is mounted using a mold of one side 60a (a first mold of one side) and a mold of the other side 70a (a first mold of the other side) and then by performing an injection molding of the thermoplastic resin. As illustrated in FIGS. 11A and 11B, the mold of one side 60a includes an outline concave portion 66a for forming at least a part of a package outline of the RFID tag. The outline concave portion 66a is a square or a rectangle in a planar view as illustrated in FIG. 11B, but the embodiment is not limited to this as long as the molds in third molding process can set the insert surely and stably. The mold of one side 60a also includes convex portions 64a that hold the antenna parts 10a of the lead frame 10 to be fixed when the lead frame 10 is clamped between the mold of the one side 60a and the mold of the other side 70a. In the present embodiment, the four convex portions 64a are provided, but the embodiment is not limited to this. Then, the mold of one side 60a is provided with a sprue 67a that injects a thermoplastic resin 50a (a first thermoplastic resin). However, the mold of one side 60a in the present embodiment does not have a concave portion (corresponding to the concave portion 62 in Embodiment 1) that disposes the lead frame 10 at a constant position (a predetermined position in a thickness direction of the package).

As illustrated in FIGS. 11D and 11E, the mold of the other side 70a, similarly to the mold of one side 60a, includes an outline concave portion 76a (a square or a rectangle in a planar view) for forming at least a part of the outline of the RFID tag. The mold of the other side 70a also includes convex portions 74a that hold the antenna parts 10a to be fixed when the lead frame 10 is clamped between the mold of one side 60a and the mold of the other side 70a. In the present embodiment, the four convex portions 74a are provided, but the embodiment is not limited to this. In each of the convex portions 74a, three concave grooves 75a are formed so as to hold the antenna part 10a to be fixed in clamping the lead frame 10. The number of the concave grooves 75a is appropriately changed in accordance with the shape of the antenna part 10a. However, the mold of the other side 70a of the present embodiment does not have a concave portion (corresponding to the concave portion 72 in Embodiment 1) that disposes the lead frame 10 at a constant position (a predetermined position in a thickness direction of the package).

As illustrated in FIG. 11C, the mold of one side 60a that is provided with the sprue 67a presses the lead frame 10 from a side of a first surface 12 (a side of amounting surface of the semiconductor device 30). The mold of the other side 70a presses the lead frame 10 from a side of a second surface 14 that is opposite to the first surface 12. Therefore, the injection molding of the thermoplastic resin 50a is performed from the side of the first surface 12 of the lead frame 10.

As illustrated in FIGS. 10A and 10B, after the second molding is performed for the lead frame 10, the semiconductor device 30, the antenna part 10a, and the mounting part 10b are filled with the thermoplastic resin 50a. In the present embodiment, any convex portion is not formed in the thermoplastic resin 50a by the second molding, and the thermoplastic resin 50a is configured so as to be planar, except that through holes 54a are formed. Also, as to the side surfaces of the thermoplastic resin 50a, convex portions corresponding to the convex portions 55a to 55f as described in Embodiment 1 are not formed, and each of the side surfaces is planar.

Figure 12A:
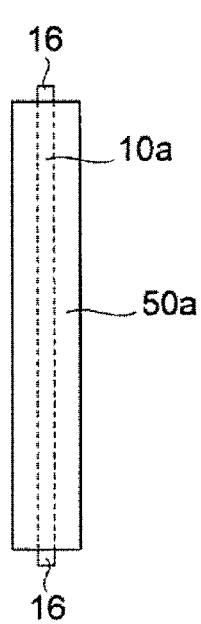
FIGS. 12A and 12B are configuration diagrams of a lead frame antenna after cutting in Embodiment 2 (an RFID tag before a third molding is performed).
Figure 12B:
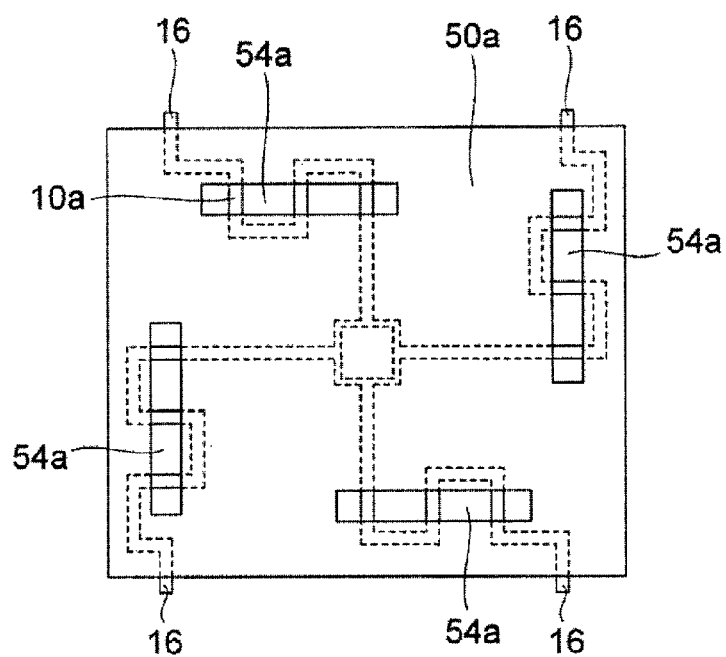

Subsequently, the lead frame 10 is cut to be divided into a plurality of parts after the second molding is performed as illustrated in FIGS. 12A and 12B. FIGS. 12A and 12B are configuration diagrams of the lead frame after the cutting (configuration diagrams of the RFID tag before the third molding is performed), and FIGS. 12A and 12B illustrate a side view and a plan view of the lead frame 10, respectively. The lead frame 10 is cut at connected lead parts 16 illustrated in FIG. 10B to be divided into a plurality of parts after the second molding is performed. In this state, only the remained connection lead part 16 and the antenna part 10a in the through holes 54a are exposed, and the other configuration elements are filled with the thermoplastic resin 50.

Figure 14A:
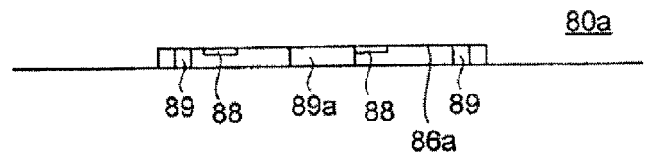
FIGS. 14A to 14E are configuration diagrams of a main part of a mold that is used for performing the third molding of the RFID tag in Embodiment 2.
Figure 14B:
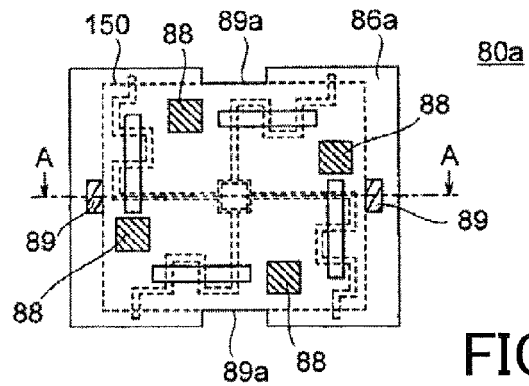
Figure 14C:
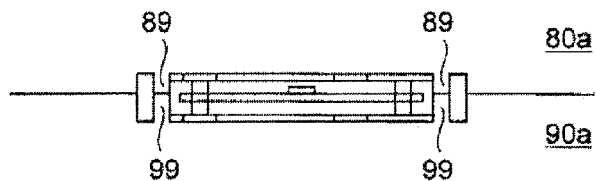
Figure 14D:
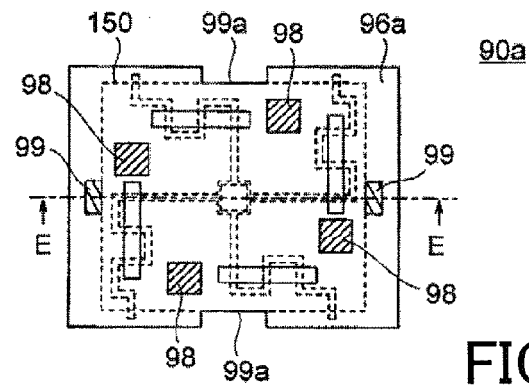
Figure 14E:
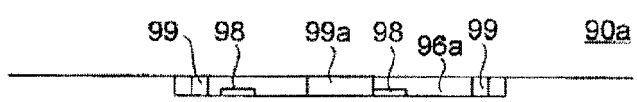

Next, referring to FIGS. 13A to 13D, and 14A to 14E, the third molding process of the RFID tag will be described. FIGS. 13A to 13D are configuration diagrams of the RFID tag after the third molding is performed, and FIGS. 13A to 13D illustrate a side view, a B-B cross-sectional view of FIG. 13D, a C-C cross-sectional view of FIG. 13D, and a plan view of the RFID tag, respectively. FIGS. 14A to 14E are configuration diagrams of a main part of the mold that is used for performing the third molding. FIGS. 14A and 14B illustrate a cross-sectional view and a plan view of the mold of one side, respectively, and the cross section of FIG. 14A corresponds to an A-A cross section in FIG. 14B. FIG. 14C illustrates a state where the RFID tag obtained after the second molding is clamped by using the mold of one side and the mold of the other side and then the third molding (the resin molding) is performed. FIGS. 14D and 14E illustrate a plan view and a side view of the mold of the other side, respectively, and the cross section of FIG. 14E corresponds to an E-E cross section in FIG. 14D.

The third molding of the present embodiment is performed by clamping the RFID tag obtained after the second molding is performed by using a mold of one side 80a (a second mold of one side) and a mold of the other side 90a (a second mold of the other side) and by performing the injection molding of a thermoplastic resin. As illustrated in FIGS. 14A and 14B, the mold of one side 80a includes an outline concave portion 86a that forms an outline of the package of the RFID tag. The mold of one side 80a includes four convex portions 88 that perform the alignment in a vertical direction of the antenna part 10a in the third molding. Furthermore, the mold of the one side 80a is provided with convex portions 89 and 89a that perform the alignment in an in-plane direction of the antenna part 10a in the third molding so as to contact a center portion of each of the four side surfaces of the RFID tag (region 150) after the second molding is performed.

As illustrated in FIGS. 14D and 14E, the mold of the other side 90a, similarly to the mold of one side 80a, includes an outline concave portion 96a that forms an outline of the package of the RFID tag. The mold of the other side 90a further includes four convex portions 98 that perform the alignment of the antenna part 10a in the vertical direction in the third molding. In some implementations, t is preferable that the convex portions 98 are provided at positions corresponding to the convex portions 88, i.e. overlapped positions viewing in the vertical direction, but they may also be provided at positions different from each other. In addition, the mold of the other side 90a is provided so that the convex portions 99 and 99a that perform the alignment of the antenna part 10a in the in-plane direction in the third molding contact the center portion of each of the four side surfaces of the RFID tag (the region 150) after the second molding is performed. As illustrated in FIG. 14C, when the RFID tag is clamped between the mold of one side 80a and the mold of the other side 90a, the convex portions 89 and 89a contact the concave portions 99 and 99a respectively to perform the alignment of the RFID tag in the in-plane direction to be surely fixed. In the plan views of FIGS. 14B and 14D, the outline of the RFID tag after the second molding is performed (the region 150) and a reference structure of the RFID tag are indicated by dashed lines.

When the third molding is performed using the mold of the one side Boa and the mold of the other side 90a, the RFID tag illustrated in FIGS. 13A to 13D is formed. The third molding is performed by the injection molding of a thermoplastic resin 56a (a second thermoplastic resin). In the RFID tag obtained after the third molding is performed, four concave portions 58 are formed on each of both the first surface 22 and the second surface 24. The concave portions 58 are formed by the convex portions 88 of the mold of one side 80a and the convex portions and the convex portions 98 of the mold of the other side 90a in performing the alignment of the antenna part boa in the vertical direction in the third molding.

Furthermore, in the RFID tag obtained after the third molding is performed, concave portions 59a formed by the convex portions 89a of the mold of one side 80a and the convex portions 99a of the mold of the other side 90a are formed at center portions of two side surfaces opposite to each other. In addition, through holes 59 formed by the convex portions 89 of the mold of one side 80a and the convex portions 99 of the mold of the other side 90a are formed near the centers of two side surfaces different from the two side surfaces on which the concave portions 59a are formed. The concave portions 59a and the through holes 59 are formed in performing the alignment of the antenna part 10a in the in-plane direction in the third molding.

Thus, the thermoplastic resin 56a includes the concave portions 58 and 59a and the through holes 59 that are formed by the injection molding of both the surfaces of the lead frame (the thermoplastic resin 50a) with reference to positions of external surfaces (main surfaces and side surfaces) of the thermoplastic resin 50a. In other words, the alignment of the main surfaces of the RFID tag in the vertical direction is performed by the concave portions 58, and the alignment in the in-plane direction is performed by the concave portions 59a and the through holes 59. According to the configuration of the present embodiment, since the alignment of the antenna part is surely performed, a high-performance RFID tag can be provided.

As described above, in the RFID tag in Embodiments 1 and 2, the antenna part 10a is formed using the lead frame 10. Therefore, the thickness of the cross-section of the antenna part is increased and the size of the antenna part can be reduced. Since the semiconductor device 30 is filled with the thermoset resin 40, the semiconductor device 30 can be effectively protected. The RFID tag is packaged using the thermoplastic resins 50 and 56 (the thermoplastic resins 50a and 56a). Therefore, the RFID tag with high resistance properties such as impact resistance, weather resistance, and water resistance can be provided. According to the method of manufacturing the RFID tag of each embodiment described above, the position of the antenna part in a thickness direction (in a vertical direction) and in an in-plane direction of a package resin (the thermoplastic resins 50 and 56, and the thermoplastic resins 50a and 56a) can be controlled to dispose the antenna part at an appropriate position.

Embodiment 3

Next, a configuration of a wireless charging antenna part in Embodiment 3 of the present invention and a method of manufacturing it will be described. The wireless charging antenna part of the present embodiment is a wireless charging antenna part that generates an electromotive force, which is used for a wireless charger or the like.

The wireless charger of the present embodiment does not mount a semiconductor device in contrast to the RFID tag of Embodiments 1 and 2. Therefore, in the present embodiment, the first molding that is described in Embodiments 1 and 2 is not performed, and the second molding that protects the antenna and that performs a position control of the antenna, and the third molding that determines the outline of the wireless charging antenna part that is a final product is only performed.

First of all, referring to FIGS. 15A and 15B, a configuration of a lead frame (a lead frame antenna) that is used as the wireless charging antenna part in the present embodiment will be described. FIGS. 15A and 15B are configuration diagrams of a lead frame 100 that is used as the wireless charging antenna part in the present embodiment, and FIGS. 15A and 15B illustrate a plan view and a side view of the lead frame 100, respectively. The lead frame 100 is, similarly to the lead frame 10 of Embodiments 1 and 2, for example, made of a metal of a cupper alloy or an iron alloy having a thickness of 0.15 mm, which is formed by a stamping process (a press process) or an etching process. The lead frame 100 is configured by including an antenna part 100a that functions as a wireless charging antenna. However, the antenna part 100a of the present embodiment is not limited to the shape as illustrated in FIG. 15A, and it can be configured by another shape.

The lead frame 100 is cut to be divided into some pieces by a cutting process (not shown), and a region 220 surrounded by a dashed line is used for manufacturing one wireless charging antenna part. In other words, in FIG. 15A, a part of the lead frame 100 that is used as three wireless charging antenna parts after cutting is illustrated.

Next, referring to FIGS. 16A and 16B, a second molding process of the lead frame 100 will be described. FIGS. 16A and 16B are configuration diagrams of the lead frame 100 after the second molding is performed, and FIGS. 16A and 16B are a side view and a plan view of the lead frame 100, respectively. The second molding of the present embodiment is, similarly to Embodiment 2, performed by clamping the lead frame 100 using the first mold of one side and the first mold of the other side (not shown) and by performing the injection molding of the thermoplastic resin.

The first mold of one side and the first mold of the other side include outline concave portions that forms at least a part of the outline of a package of the wireless charging antenna part. These molds include convex portions that hold the antenna part 100a of the lead frame 100 to be fixed when the lead frame 100 is clamped. A concave groove that holds the antenna part 100a to be fixed in clamping it is formed on a convex portion of at least one of the first mold of one side and the first mold of the other side. The number of the concave grooves is appropriately changed in accordance with the shape of the antenna part 100a.

The mold of one side presses the lead frame 100 from a side of a first surface 320 of the lead frame 100. The mold of the other side presses the lead frame 100 from a side of a second surface 340 that is opposite to the first surface 320. Thus, the lead frame 100 is clamped and the injection molding of a thermoplastic resin 500 (a first thermoplastic resin) is performed for the lead frame 100.

As illustrated in FIGS. 16A and 16B, in the lead frame 100 after the second molding, the antenna part 100a is filled with the thermoplastic resin 500. In the present embodiment, the thermoplastic resin 500 after the second molding is planar, and a through hole 540 is formed at a predetermined position. The through hole 540 is formed by pressing the antenna part 100a using the convex portion (the convex portion in which the concave grooves are formed) of the mold in order to prevent the antenna part 100a from deforming in clamping (in the second molding) by the mold and from deforming due to a flow pressure of resin.

Subsequently, the lead frame 100 after the second molding is cut to be divided into the plurality of parts as illustrated in FIGS. 17A and 17B. FIGS. 17A and 17B are configuration diagrams of the cut lead frame (configuration diagrams of the wireless charging antenna part before a third molding is performed), and FIGS. 17A and 17B illustrate a side view and a plan view of the lead frame. The lead frame 100 after the second molding is cut at four connected lead parts 160 illustrated in FIG. 17B to be divided into some pieces. In this state, only the remained connection lead parts 160 and the antenna part 100a in the through hole 540 are exposed, and other configuration elements are filled with the thermoplastic resin 500.

Next, referring to FIGS. 18A and 18B, the third molding process of the wireless charging antenna part will be described. FIGS. 18A and 18B are configuration diagrams of the wireless charging antenna part after the third molding, and FIGS. 18A and 18B illustrate a side view and a plan view of the wireless charging antenna part, respectively. The third molding of the present embodiment is performed by clamping the wireless charging antenna part after the second molding using a second mold of one side and a second mold of the other side (not shown) and by performing an injection molding of a thermoplastic resin 560 (a second thermoplastic resin).

The second mold of one side and the second mold of the other side include outline concave portions that form an outline of the package of the wireless charging antenna part. These molds are provided with two convex portions that perform the alignment of the antenna part 100a in a vertical direction in the third molding. Furthermore, these molds are provided with convex portions that perform the alignment of the antenna part 100a in an in-plane direction in the third molding so as to contact a center portion of each of four side surfaces of the wireless charging antenna part after the second molding. Therefore, at the time of clamping the wireless charging antenna part, the alignment of the wireless charging antenna part in the in-plane direction is performed in a state where the convex portions contact each other to be surely fixed.

The third molding is performed by the injection molding of the thermoplastic resin 560 (the second thermoplastic resin).

As illustrated in FIGS. 18A and 18B, the wireless charging antenna part after the third molding is provided with two concave portions 580 on each of both the first surface 420 and the second surface 440. The concave portions 580 are formed by the two convex portions provided on each of the second mold of one side and the second mold of the other side when the alignment of the antenna part 100a in the vertical direction in the third molding is performed.

Additionally, two through holes 590 and two concave portions 590a are formed in the wireless charging antenna part after the third molding by four convex portions of each of the second mold of one side and the second mold of the other side. The through holes 590 and the concave portions 590a are formed when the alignment of the antenna part 100a in the in-plane direction is performed in the third molding.

Thus, the thermoplastic resin 560 includes the concave portions 580 and 590a and the through holes 590 formed by performing the injection molding on both surfaces of the lead frame (the thermoplastic resin 500) with reference to an outer surfaces (main surfaces and side surfaces) of the thermoplastic resin 500. In other words, the alignment of the main surfaces of the wireless charging antenna part in the vertical direction is performed by the concave portions 580, and the alignment in the in-plane direction is performed by the through holes 590 and the concave portions 590a. According to the configuration of the present embodiment, a high-performance wireless charging antenna part can be provided because the alignment of the antenna part is surely performed.

Additionally, in the wireless charging antenna part of the present embodiment, a through hole 550 is formed. An exposure part 170a that connects the antenna part 100a is constituted by the through hole 550. One suspension lead part 160 also constitutes an exposure part 170b for connecting the antenna. However, the present embodiment is not limited to this, and at least one of the exposure parts 170a and 170b may also be configured to be exposed. The exposure part 170a, similarly to the exposure part 170b, can be exposed outside the wireless charging antenna part.

The molds that are used in the second molding and the third molding of the present embodiment have the same characteristics as those of the molds in Embodiment 2, but the present embodiment is not limited to this, and the wireless charging antenna part of the present embodiment can also be manufactured by using the molds having the same characteristics as those of the molds in Embodiment 1.

As described above, in the wireless charging antenna part of the present embodiment, the antenna part 100a is formed by using the lead frame 100. Therefore, the thickness in the cross section of the antenna is increased, and the size of the antenna can be reduced. The wireless charging antenna part is packaged using the thermoplastic resins 500 and 560. Therefore, the wireless charging antenna with high resistance properties such as impact resistance, weather resistance, and water resistance can be provided. According to the method of manufacturing the wireless charging antenna of the present embodiment, the position of the antenna part in a thickness direction (in a vertical direction) and in an in-plane direction of a package resin (the thermoplastic resins 500 and 560) can be controlled to dispose the antenna part at an appropriate position.

According to each of the above embodiments, high-performance RFID tag and wireless charging antenna part, and methods of manufacturing the RFID tag and the wireless charging antenna part, and molds that are used for manufacturing the RFID tag and the wireless charging antenna part can be provided because the deformation and the external exposure is prevented and also the resin mold of the antenna part is performed at a constant position.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

For example, in the RFID tag of Embodiments 1 and 2, the semiconductor device is filled with the thermoset resin, but the embodiments are not limited to this and the semiconductor device may also be filled with the thermoplastic resin (the first thermoplastic resin) directly. Thus, in Embodiments 1 and 2, the RFID tag can also be configured only by using the thermoplastic resins (the first thermoplastic resin and the second thermoplastic resin) without using the thermoset resin. In this case, the first thermoplastic resin is molded by a first molding process, and the second thermoplastic resin is molded by a second molding process.

The convex portion is formed at the side of the RFID tag by the molding of the first thermoplastic resin in Embodiment 1, and the concave portion is formed at the side of the RFID tag by the molding of the first thermoplastic resin in Embodiment 2, but the molding of the first thermoplastic resin can also be performed by combining the concave portion and the convex portion at the side of the RFID tag and thus the reference of the second thermoplastic resin is molded by the first thermoplastic resin.

What is claimed is:

1. An RFID tag that performs a wireless communication, comprising:
   an antenna part formed by a lead frame;
   a semiconductor device mounted on the lead frame;
   a first injection molded thermoplastic resin formed on both surfaces of the lead frame so that the semiconductor device is filled, and including a first set of convex portions at both sides of the lead frame opposite to each other and a second set of convex portions at side surfaces of the first injection molded thermoplastic resin; and
   a second injection molded thermoplastic resin formed on both surfaces of the lead frame aligned, in a vertical direction, with surfaces of the first set of convex portions of the first injection molded thermoplastic resin, the second injection molded thermoplastic resin being aligned, in an in-plane direction, with surfaces of the second set of convex portions of the first injection molded thermoplastic resin at the side surfaces,
   wherein the first injection molded thermoplastic resin includes a portion of the antenna part disposed inside a concavoconvex portion of a mold, the antenna part aligned in the vertical direction,
   wherein the aligned antenna part inside the concavoconvex portion of the mold defines a through hole in the first injection molded thermoplastic resin,
   wherein the part of the antenna part is exposed in the through hole,
   wherein the through hole and the part of the antenna part are filled with the second injection molded thermoplastic resin,
   wherein surfaces of the second injection molded thermoplastic resin and the surfaces of the first and second set of convex portions of the first injection molded thermoplastic resin constitute flat outer surfaces of a package of the RFID tag, and
   wherein the entirety of the antenna part is filled with the first and second injection molded thermoplastic resins.

2. The RFID tag according to claim 1, wherein
the semiconductor device is a bare chip or a semiconductor package that is formed by performing resin molding of the bare chip,
the semiconductor device is connected with a mounting part of the lead frame by solder, and
the semiconductor device is filled with a thermoset resin.

3. An RFID tag that performs a wireless communication, comprising:
an antenna part formed by a lead frame;
a semiconductor device mounted on the lead frame;
a first injection molded thermoplastic resin formed on both surfaces of the lead frame so that the semiconductor device is filled; and
a second injection molded thermoplastic resin formed on both surfaces of the lead frame aligned, in a vertical direction and an in-plane direction, with external surfaces of the first injection molded thermoplastic resin,
wherein the first injected molded thermoplastic resin includes a portion of the antenna part disposed inside a concavoconvex portion of a mold, the antenna part aligned in a vertical direction of a package of the RFID tag,
wherein the aligned antenna part inside the concavoconvex portion of the mold defines a through hole in the first injected molded thermoplastic resin,
wherein the part of the antenna part is exposed in the through hole,
wherein the through hole and the part of the antenna part are filled with the second injection molded thermoplastic resin,
wherein the external surfaces of the first injection molded thermoplastic resin and surfaces of the second injection molded thermoplastic resin constitute outer surfaces of the package of the RFID tag, and the outer surfaces have a first set of concave portions at both sides of the lead frame opposite to each other in which the external surfaces of the first injection molded thermoplastic resin are exposed to an outside of the package, and the outer surfaces have a second set of concave portions at side surfaces of the package,
wherein the alignment between the first and second injection molded thermoplastic resins in the vertical direction defines the first set of concave portions, and the alignment between the first and second injection molded thermoplastic resins in the in-plane direction defines the second set of concave portions, and
wherein the entirety of the antenna part is filled with the first and second injection molded thermoplastic resins.

4. The RFID tag according to claim 3, wherein
the semiconductor device is a bare chip or a semiconductor package that is formed by performing resin molding of the bare chip,
the semiconductor device is connected with a mounting part of the lead frame by solder, and
the semiconductor device is filled with a thermoset resin.

* * * * *